(12) United States Patent
Domanski

(10) Patent No.: US 9,202,760 B2
(45) Date of Patent: Dec. 1, 2015

(54) SEMICONDUCTOR DEVICES AND STRUCTURES

(75) Inventor: Krzysztof Domanski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/533,379

(22) Filed: Jun. 26, 2012

(65) Prior Publication Data

US 2013/0341730 A1 Dec. 26, 2013

(51) Int. Cl.
| | |
|---|---|
| *H01L 23/62* | (2006.01) |
| *H01L 21/8238* | (2006.01) |
| *H01L 27/07* | (2006.01) |
| *H01L 27/092* | (2006.01) |
| *H01L 27/02* | (2006.01) |
| *H01L 23/64* | (2006.01) |
| *H01L 29/78* | (2006.01) |

(52) U.S. Cl.
CPC ...... *H01L 21/823892* (2013.01); *H01L 23/647* (2013.01); *H01L 27/0251* (2013.01); *H01L 27/0727* (2013.01); *H01L 27/0921* (2013.01); *H01L 23/62* (2013.01); *H01L 29/78* (2013.01); *H01L 2924/0002* (2013.01)

(58) Field of Classification Search
CPC ..... H01L 23/62; H01L 21/8238; H01L 29/72; H02H 9/00
USPC ......... 257/107, 355, 357, 173, 162, 146, 141, 257/111, 109, E29.181, 918, 119, 658, 257/E25.002, E21.358, 925; 438/133; 361/56

See application file for complete search history.

(56) References Cited

U.S. PATENT DOCUMENTS

| | | | |
|---|---|---|---|
| 4,791,317 A | 12/1988 | Winnerl et al. | |
| 5,438,005 A | 8/1995 | Jang | |
| 5,747,837 A * | 5/1998 | Iwase et al. | 257/173 |
| 5,828,110 A | 10/1998 | Wollesen | |
| 6,444,511 B1 * | 9/2002 | Wu et al. | 438/199 |
| 6,586,292 B2 | 7/2003 | Wu et al. | |
| 6,825,504 B2 * | 11/2004 | Ishizuka et al. | 257/173 |
| 6,833,592 B2 | 12/2004 | Lee | |
| 6,858,902 B1 * | 2/2005 | Salling et al. | 257/360 |
| 7,288,450 B1 * | 10/2007 | Tailliet | 438/210 |
| 7,608,913 B2 * | 10/2009 | Secareanu et al. | 257/665 |
| 7,741,680 B2 | 6/2010 | Zhu et al. | |
| 7,855,104 B2 | 12/2010 | Voldman | |
| 2002/0187601 A1 * | 12/2002 | Lee et al. | 438/200 |
| 2003/0174452 A1 * | 9/2003 | Chen et al. | 361/56 |
| 2006/0033163 A1 * | 2/2006 | Chen | 257/355 |
| 2013/0032882 A1 * | 2/2013 | Salcedo et al. | 257/355 |

* cited by examiner

*Primary Examiner* — David Vu
*Assistant Examiner* — Mouloucoulaye Inoussa
(74) *Attorney, Agent, or Firm* — Eschweiler & Associates, LLC

(57) ABSTRACT

Devices, semiconductor structures and methods are provided, where a substrate is around a semiconductor device is biased via a resistive element.

3 Claims, 4 Drawing Sheets

SEMICONDUCTOR DEVICES AND STRUCTURES

FIELD

The present application relates to protection of semiconductor devices for example against current flow through parasitic devices which involve a junction breakdown of a pn junction.

BACKGROUND

Semiconductor devices are sometimes formed in wells, for example n-type wells formed in p-type substrates, which provides a degree of insulation from the substrate. The well and the substrate form a pn junction. However, in some cases voltages may be applied to the thus formed device, to the well or to the substrate which may cause a breakdown of the pn junction, which in turn may lead to a high breakdown current flowing. Such a current may lead to damage of the device.

DETAILED DESCRIPTION

In the following, various embodiments of the present application will be described in detail. It should be noted that these embodiments serve only as illustrating examples and are not to be construed as limiting.

Features from different embodiments may be combined with each other unless specifically noted otherwise. On the other hand, describing an embodiment with a plurality of features is not to be construed as indicating that all these features are necessary for practicing the invention, as other embodiments may comprise less features and/or alternative features.

It should be noted that in the embodiments described in the following, any direct electrical connections or couplings between functional entities, blocks or other elements, i.e. connections or couplings without intervening entities, may also be implemented by connections or couplings comprising one or more intervening elements, as long as the basic function of the connection or coupling, i.e. to transmit a signal, a voltage, a current or the like, is not impeded, and vice versa.

In some embodiments, semiconductor structures or devices are formed in a well having a polarity different from the polarity of semiconductor material surrounding the well, for example a substrate surrounding the well. The polarity of a semiconductor may either be an n-type polarity caused by an n-type doping or a p-type polarity caused by a p-type doping. In case silicon is used as a semiconductor, n-type doping may for example be achieved by using arsenic or phosphorus as dopant, while p-type doping may be achieved for example by using boron as a dopant. For other semiconductor materials, for example III-V-semiconductor like gallium arsenide, other appropriate dopants may be used.

It should further be noted that in the following drawings, elements are not necessarily represented in scale with each other, but are represented in a manner to give a clear understanding of the functional or structural relationship between the various elements.

Figure 1:
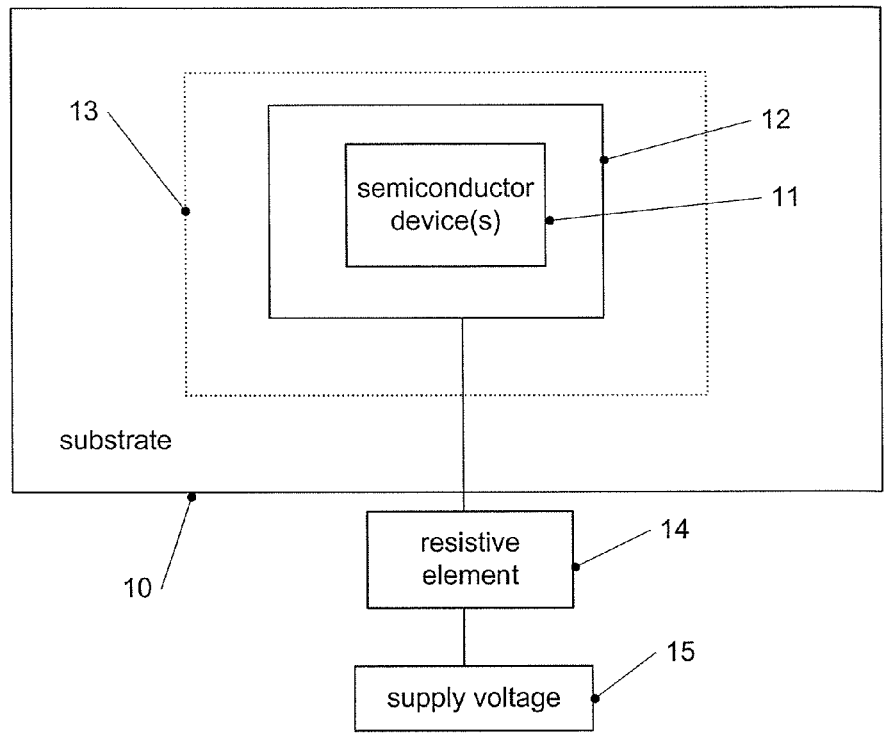
FIG. 1 is a schematic diagram showing a device according to an embodiment.

Turning not to the figures, in FIG. 1 a schematic representation of a device according to an embodiment is shown.

In the device of FIG. 1, one or more semiconductor devices 11 are provided in a substrate 10. Semiconductor devices 11 may for example be provided in a semiconductor well having a polarity different from a polarity of substrate 10, such that a pn junction is formed between the well and substrate 10. One or more semiconductor devices 11 may for example comprise a transistor like a PMOS transistor or an NMOS transistor, a diode, logic circuitry or any other kinds of semiconductor devices and semiconductor circuitry.

Around semiconductor device(s) 11 a substrate contact 12 is provided. In some embodiments, a distance of substrate contact 12 from semiconductor device(s) 11 or a well in which semiconductor device(s) 11 are formed may be at a minimum distance allowed by the respective semiconductor design (minimum design rule), and/or above, for example a few micrometers.

Substrate contact 12 is coupled to a supply voltage 15, for example VDD, VSS or ground via a resistive element 14. Resistive element 14 may for example be a resistor or also a transistor like a PMOS transistor or an NMOS transistor acting as a resistive transfer structure. Generally, a resistive element in the context of this application is to be understood as an element which deliberately increases an electrical resistance of a connection or coupling above a resistance which would be present if a standard electrical connection, for example a connection via a metal wire, a metal layer or highly doped polysilicon, would be used. For such conventional connections, the aim is to keep the resistance as low as possible. A resistance value of resistive element 14 may for example be greater than 100Ω, in particular greater than 500Ω, for example about 1 kΩ or more. In some embodiments, resistive element 14 may be an adjustable resistive element, the resistance value of which may be adjusted. For example, in case the resistive element comprises a MOS transistor, the effective resistance may be adjusted by adjusting a gate voltage of the transistor. Resistive element 14 together with contact 12 that forms a biasing circuitry to bias substrate 10 around semiconductor device(s) 11 with supply voltage 15.

In the embodiment of FIG. 1, within a predetermined distance from semiconductor device(s) 11 as indicated by a dotted line 13 only substrate contacts to supply voltage 15 via a resistive element like resistive element 14 are provided. Outside this area marked by dotted line 13, also substrate contacts coupled with supply voltage 15 without resistive element are allowed. In other words, all connections between substrate 10 and supply voltage 15 having a resistance less than a predetermined resistance, e.g. a resistance of resistive element 14, are provided outside the area marked by dotted line 13, i.e. a predetermined minimum distance away from semiconductor device(s) 11. The above mentioned distance may for example be several ten micrometers, for example at least 20 micrometer μm, for example 50 μm micrometer or more.

With an embodiment as shown in FIG. 1, leakage currents in a case of a breakdown of a pn junction formed between a well of semiconductor device(s) 11 and substrate 10 as explained above may be reduced, as will be explained further below in some more detail.

Figure 2:
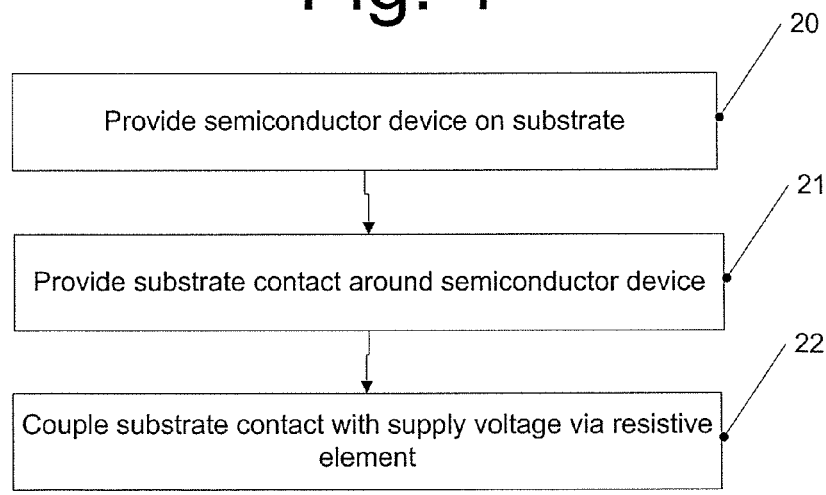
FIG. 2 shows a flowchart illustrating a method according to an embodiment.

In FIG. 2, a flowchart illustrating a method according to an embodiment is shown. While the method in FIG. 2 is presented as a series of acts or events, it should be noted that the depicted order of these acts or events is not to be construed as limiting, and in other embodiments the acts or events may occur in different order, or at least some acts or events may be performed concurrently with each other.

At 20, a semiconductor device is provided on a substrate, for example a transistor, a diode or a circuit comprising such transistors and/or diodes, or a part of such a circuit. The semiconductor device may be provided within a well of a polarity different from a polarity of the substrate. For example, the semiconductor device may be provided in an n-well within a p-type substrate, or a p-well within an n-type substrate.

At 21, a substrate contact around the semiconductor device is provided, for example at a small distance of some micrometers and/or a distance corresponding to a minimum design rule from the semiconductor device. In other embodiments, instead of a single contact around the device also a contact not completely surrounding the device and/or a plurality of contacts distributed around the semiconductor device may be provided.

At 22, the substrate contact is coupled with a supply voltage, for example VDD, VSS or ground, via a resistive element like a resistor or a transistor acting as a resistor.

Figure 3:
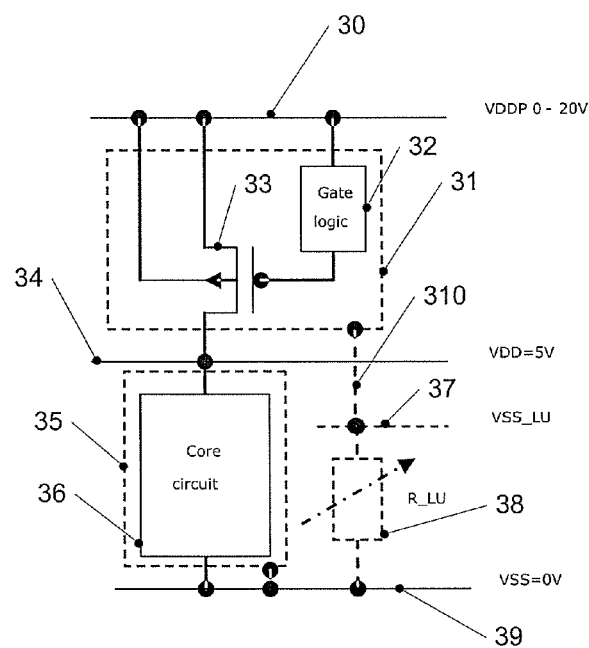
FIG. 3 shows a schematic circuit diagram of a device according to an embodiment.

In FIG. 3, a schematic circuit diagram of a circuit according to an embodiment is shown. In the circuit of FIG. 3, three supply voltages are provided, namely VDDP, for example between 0 and 20 V, on a supply voltage rail 30, VDD, for example 5 V, on a supply voltage rail 34 and VSS, for example 0 V, on a supply voltage rail 39. In other embodiments, other supply voltages may be used.

In the example of FIG. 3, voltage rail 30 is coupled with voltage rail 34 via a PMOS transistor 33, i.e. voltage rail 30 is connected to one of source and drain of PMOS transistors 33 and voltage rail 34 is connected to the other one of source and drain of PMOS transistor 33. PMOS transistor 33 further comprises a well terminal which is also coupled with voltage rail 30. A gate logic 32 is provided controlling a gate of PMOS transistor 33 depending on a voltage at voltage rail 30, i.e. depending on VDDP. In some embodiment, PMOS transistor 33 and gate logic 32 may act as a voltage regulator to regulate VDD to 5 V or another desired voltage, e.g. 3.3 V or 2 V, irrespective of the precise voltage value of VDDP.

Around PMOS transistor 33, a substrate contact is provided indicated by dashed line 31. Substrate contact 31 is connected to a "virtual resistive ground" 37 which is derived from VSS, i.e. the voltage at voltage rail 39, via an adjustable resistive element 38. During normal operation, as will be explained below in further detail, only negligible current flows via resistive element 38, such that the voltage drop over resistive element 38 is negligible and the virtual ground 37, also referred to as VSS_LU, is essentially at the same potential as VSS, for example 0 V. However, in case of breakdown of a diode formed between a well of PMOS transistor 33 and the substrate, resistive element 38 may help to reduce a leakage current flowing.

A core circuit 36, i.e. any kind of circuit for performing specific functions desired by a designer of the circuit of FIG. 3, is coupled between voltage rails 34 and 39 to receive a corresponding voltage supply. Moreover, around core circuit 36 a substrate contact 35 is provided which is coupled to voltage rail 39, i.e. to VSS. In some embodiments, a predetermined minimum distance, for example at least 20 μm, is kept between substrate contact 35 and PMOS transistor 33. In some embodiments, the predetermined distance 13 indicated in FIG. 1 may be a predetermined distance from substrate contact 12.

Figure 4:
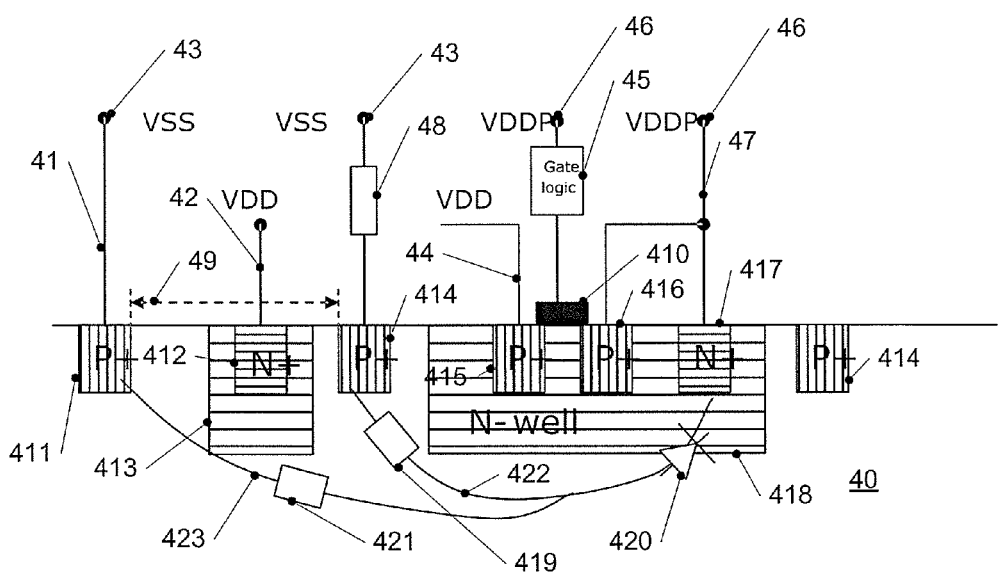
FIG. 4 shows a semiconductor structure according to an embodiment.

In FIG. 4, a semiconductor structure according to an embodiment is shown. The semiconductor structure of FIG. 4 is provided within a substrate 40, for example a p-type substrate. Within substrate 40, a PMOS transistor is provided within an n-type well 418.

For forming the PMOS transistor, within n-well 418 two p-wells 415, 416 with a high dopant concentration (p+ doping) are provided, and a gate 410, for example a metal gate or polysilicon gate, is provided on the substrate with an insulation (not shown) therebetween, for example an $SiO_2$ insulation in case of a silicon semiconductor structure, as conventionally used for PMOS transistors. P-type wells 415 and 416 serve as source and drain contacts of the PMOS transistors. Furthermore, a highly doped n-type well 417 is provided within n-well 418 to serve as contact for n-well 418.

It should be noted that the thus formed PMOS transistor is symmetric, so that the designations source and drain for p-wells 415 and 416 are somewhat arbitrary, i.e. each well can serve either as source or drain of the PMOS transistor.

Similar to PMOS transistor 33 of FIG. 3, gate 410 is controlled by a gate logic 45 depending on a voltage VDDP 46. Supply voltage VDDP may for example be a varying voltage up to e.g. 20 V. Supply voltage VDDP 46 is also applied via connections 47 to p-well 416 and to n-well 418 via n-well 417 serving as contact. P-well 415 is coupled to a supply voltage VDD via a connection 44. VDD may for example be a supply voltage of 5 V, 3.3 V or 2 V.

Around n-well 418 of the PMOS transistor, a substrate contact in form of a ring-like p-well 414 is provided. The form of this ring-like p-well may depend on the form of n-well 418 and may be provided to follow the contours of n-well 418. In some embodiments, the ring-like p-well 414 may be rectangular or circular, although other forms are possible as well. Of ring-like p-well 414, in the cross-sectional view of FIG. 4 only the portions left and right of n-well 418 are visible.

Ring-like p-well 414 is coupled with a supply voltage VSS 43 via a resistive element 48, for example a resistor or a transistor like a NMOS transistor operated as a resistive element.

Via resistive element 48 and substrate contact 414, a substrate in the vicinity of n-well 418 may be biased to VSS. It should be noted that in normal operation at best a negligible current flows via resistive element 48, such that a voltage drop via resistive element 48 is negligible.

Resistive element 48 may have a resistance of at least 100Ω, for example more than 500Ω, for example about 1 kΩ or more.

A predetermined distance 49 away from substrate contact 414, for example a distance of several 10 μm micrometers, for example at least 20 μm micrometer, a further substrate contact 411 in form of a highly doped p-well may be provided, for example around a core circuit as shown in FIG. 3. Substrate contact 411 via a connection 41 may be directly coupled with VSS 43 to bias substrate 40 accordingly.

Optionally, in some embodiment between substrate contact 411 and substrate contact 414 an n-well 413 may be provided, which is coupled via an n-contact 412 of highly n-doped silicon material and via a connection 42 to supply voltage VDD.

Between n-well 418 and p-type substrate 40 in the embodiment of FIG. 4 a pn junction is formed, represented by a diode symbol 420 in FIG. 4. In some biasing conditions, for example due to VDDP being outside a normal operating range, a breakdown of this pn junction may occur, which causes current to flow from n-well 418 biased at VDDP 46 to a substrate contact biased at VSS 43. Two such current paths 422, 423 are shown in FIG. 4. Current path 422 has a resistance due to substrate resistance symbolized by a resistor 419. Current path 423 has a resistance based on substrate resistivity as symbolized by an resistance 421. It should be noted that if, as in FIG. 4, optional n-well 413 is provided, current path 423 cannot run "straight" from the pn junction represented as diode 420 to substrate contact 411, but has to go "around" n-well 413, which increases resistance 421 as a longer path has to be traveled within substrate 40.

As current path 423 is longer than current path 422, resistance 421 is larger than resistance 419 in the embodiment of FIG. 4. On the other hand, between ring-like p-well 414 serving as substrate contact and VSS 43 resistive element 48 is provided adding additional resistance to the current path to VSS via current path 422. By choosing a resistance value of resistive element 48 appropriately, the current via current path 422 may be limited to a desired threshold value for given biasing conditions. Moreover, by selecting distance 49 appropriately, resistance 421 may also be made sufficiently large to keep current via current path 423 below a desired threshold value for given biasing conditions. Therefore, by providing resistive element 48 can limit the current via current path 422. Furthermore, choosing distance 49 appropriately may limit the current via current path 423. Therefore, in some embodiments by choosing distance 49 and resistive element 48 accordingly, the overall current may be limited to a predetermined value for given biasing conditions, i.e. for example for given voltages VDDP.

Figure 5:
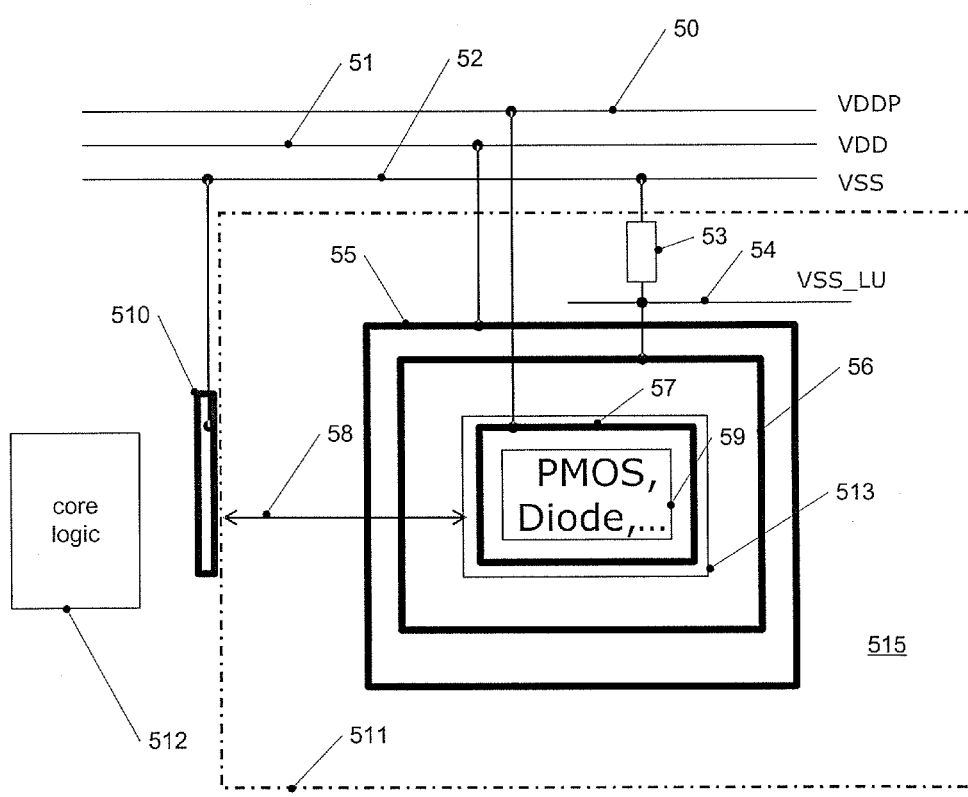
FIG. 5 shows a schematic top view of a device according to an embodiment.

In FIG. 5, a further embodiment of a device according to an embodiment is shown. In particular, in FIG. 5 a top-view of a semiconductor substrate 515 with a device according to an embodiment formed therein is shown.

In the device of FIG. 5, a semiconductor device 59, for example a PMOS transistor, an NMOS transistor, a diode or any other circuitry or part thereof, is formed in a well 513 of a first polarity different from a second polarity of substrate 515. For example, well 513 may be an n-well, and substrate 515 may be a p-type substrate.

An n-well contact 57 is provided in n-well 513, for example in form of a highly doped ring-like n-well, which in turn is coupled with VDDP present on a voltage rail 50.

Around n-well 513, for example at a distance thereto given by a minimum design rule, for example a distance of a few micrometers, a substrate contact 56 is provided, for example in form of a highly doped ring-like p-well. Substrate contact 57 is coupled with a "virtual resistive ground" 54 which is generated from a voltage VSS present on a voltage rail 52 via a resistive element 53 as shown in FIG. 5. Resistive element 53 may for example be a resistor or a transistor like a MOS transistor operating as a resistive element, and may for example provide a resistance of at least 100Ω, for example more than 500Ω, for example about 1 kΩ or more.

Around substrate contact 46, a ring-like n-well 55 with a corresponding contact region is provided which is coupled to a voltage rail 51 at VDD, for example 5 V. N-well 55 may also be referred to as n-well guard ring.

As indicated by dot-dashed line 511, within a distance 58 from n-well 513 no substrate contact directly connected to VSS are present, but only substrate contact 56 which is coupled to "virtual ground" 54. Outside the area enclosed by dot-dashed line 511, a further substrate contact 510 may be connected which is coupled directly to VSS. Furthermore, a core logic 512 which is an example for a core circuit may be provided outside the area defined by dot-dashed line 511. While in FIG. 5 distance 58 is measured from n-well 513, the distance may also be measured from substrate contact 56, similar to distance 49 of FIG. 4.

Through the provision of substrate contact 56 coupled to VSS only via a resistive element 553, and through choosing a appropriate distance 58, the currents through the substrate in case of a junction breakdown as explained with reference to FIG. 4 may be reduced and/or kept to a desired value for given biasing conditions.

It should be noted that the embodiment of FIGS. 4 and 5 may be combined. In this case, FIG. 4 essentially represents a cross-sectional view of such a combined embodiment, and FIG. 5 represents a top view.

Figure 6:
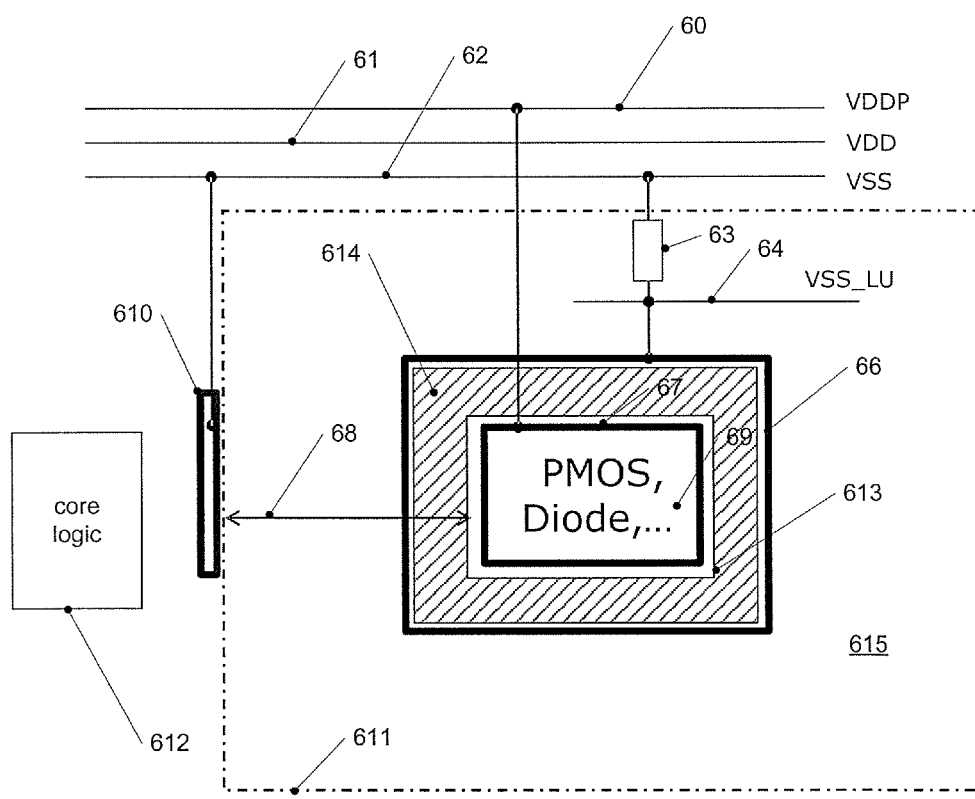
FIG. 6 shows a top view of a device according to an embodiment.

A further device according to an embodiment is shown in FIG. 6. The embodiment of FIG. 6 is a variation of the embodiment of FIG. 5, and corresponding elements bear the same reference numeral with the leading "5" replaced by a leading "6". These elements, i.e. elements 60 to 64, 66 to 613 and 615 will not be described again in detail.

As compared to the embodiment of FIG. 5, n-well 55 has been omitted. In other embodiments, such an n-well may be present.

Furthermore, an area 614, sometimes referred to as BF moat, is provided around n-well 613.

Such an area may for example have a low doping concentration (for example $10^{15}$ cm$^{-3}$ or less) and/or may be provided with polycrystalline or amorphous silicon, for example achieved through ion irradiation, to increase resistance. Such an area 614 may provide an additional resistance to reduce currents in case of junction breakdown.

It should be noted that the above embodiments serve only as examples and are not to be construed as limiting. In other embodiments, for example polarities may be reversed, and additionally the role of various voltages (for example VSS and VDD) may be exchanged. In other words, n-polarities may be substituted by p-polarities and vice versa.

While in some of the embodiments rectangular forms have been shown for devices, contacts, etc., other forms, for example circular forms, are equally possible.

In the claims:

1. A semiconductor structure, comprising:
   a first well of a first polarity provided in a substrate of a second polarity different from said first polarity,
   a well contact provided in said first well of the first polarity to be coupled with a first supply voltage,
   a semiconductor device in said first well,
   a second well of said second polarity with a higher doping concentration than said substrate arranged around said first well of the first polarity, said second well of the second polarity being coupled to a resistive element that is distinct from the substrate, said resistive element to be coupled with a second supply voltage and is located above the substrate, wherein said resistive element comprises at least one of a resistor or a transistor.

2. A semiconductor structure, comprising:
   a first well of a first polarity provided in a substrate of a second polarity different from said first polarity,
   a well contact provided in said first well of the first polarity to be coupled with a first supply voltage,
   a semiconductor device in said first well,
   a second well of said second polarity with a higher doping concentration than said substrate arranged around said first well of the first polarity, said second well of the second polarity being coupled to a resistive element that is distinct from the substrate, said resistive element to be coupled with a second supply voltage and is located above the substrate;

a third well of said second polarity arranged in said first well of said first polarity and a fourth well of said second polarity arranged in said first well of the first polarity, and a gate electrode on said substrate between said third well and said fourth well;

a fifth well of said second polarity having a higher doping concentration than said substrate and being arranged in said substrate, a distance between said fifth well of said second polarity and said second well of said second polarity being at least a predetermined distance, the fifth well of said second polarity to be coupled with said second supply voltage via a connection having a resistance smaller than the resistance of said resistive element.

3. The semiconductor structure of claim 2, further comprising a sixth well of said first polarity being provided between said second well of said second polarity and said fifth well of said second polarity, said sixth well of said first polarity to be coupled with a third supply voltage.

* * * * *